United States Patent
Hoshino et al.

(10) Patent No.: US 6,254,747 B1
(45) Date of Patent: *Jul. 3, 2001

(54) MAGNETRON SPUTTERING SOURCE ENCLOSED BY A MIRROR-FINISHED METALLIC COVER

(75) Inventors: Akira Hoshino; Toyoshi Uchiyama; Ken-ichi Takagi; Tadashi Yamamoto, all of Kanagawa-ken (JP)

(73) Assignee: Nihon Shinku Gijutsu Kabushiki Kaisha, Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/988,071

(22) Filed: Dec. 10, 1997

(30) Foreign Application Priority Data

| Dec. 25, 1996 | (JP) | 8-346217 |
| Dec. 25, 1996 | (JP) | 8-346218 |
| Dec. 25, 1996 | (JP) | 8-346219 |

(51) Int. Cl.$^7$ .................................................. C23C 14/34
(52) U.S. Cl. .............................. 204/298.11; 204/298.06; 204/298.16; 204/298.19
(58) Field of Search .................. 204/192.12, 298.09, 204/16, 23, 26, 25, 31, 35, 34, 36, 37, 298.04, 298.08, 298.12

(56) References Cited

U.S. PATENT DOCUMENTS

| 4,756,815 | * | 7/1988 | Turner et al. | 204/298.25 |
| 4,851,101 | * | 7/1989 | Hutchinson | 204/298.25 |
| 4,865,709 | * | 9/1989 | Nakagawa et al. | 204/192.12 |
| 5,066,381 | * | 11/1991 | Ohta et al. | 204/298.12 |
| 5,178,739 | * | 1/1993 | Barnes et al. | 204/192.12 |
| 5,286,296 | * | 2/1994 | Sato et al. | 204/298.26 |
| 5,417,834 | * | 5/1995 | Latz | 204/298.11 |

(List continued on next page.)

FOREIGN PATENT DOCUMENTS 08 302 464 * 1/1996 (JP) .

OTHER PUBLICATIONS

Abstract of Japanese Patent No. 61 091320 A, May 1986.*

Primary Examiner—Nam Nguyen
Assistant Examiner—Gregg Cantelmo
(74) Attorney, Agent, or Firm—Armstrong, Westerman, Hattori, McLeland & Naughton, LLP

(57) ABSTRACT

A sputtering apparatus has a permanent, magnet for forming, in front of a target, a magnetic field for magnetron discharging. The permanent magnet is disposed behind the target and an RF induction discharge coil is disposed in front of the target. The permanent magnet is contained inside an evacuated cathode case which is in the form of a container and which is provided therein with a circulation passage for cooling water. The cathode case and the RF induction discharge coil are enclosed therearound by a metallic cover which has an aperture for emitting sputtered particles. To make an element for a magnetoresistance head, a substrate is transferred from a load lock chamber to a pre-treatment chamber to clean it therein by an etching apparatus. The substrate is then transferred to an ultrahigh vacuum film deposition chamber which is provided therein with a plurality of inductively coupled RF plasma-assisted magnetron sputtering apparatuses which are evacuated to an ultrahigh vacuum. Extremely thin multiple layers of flat non-magnetic layers and magnetic layers are alternately deposited therein on the substrate. The deposition is controlled by opening and closing a shutter which is disposed in a position to prevent splashing of the sputtered particles to the substrate. The substrate is moved to a position of respective sputtering apparatuses inside the film deposition chamber to deposit different kinds of films.

2 Claims, 12 Drawing Sheets

U.S. PATENT DOCUMENTS

| | | | | |
|---|---|---|---|---|
| 5,431,799 | * | 7/1995 | Mosely et al. | 204/298.06 |
| 5,439,574 | * | 8/1995 | Kobayashi et al. | 204/298.15 |
| 5,620,578 | * | 4/1997 | Hurwitt | 204/298.25 |
| 5,660,114 | * | 8/1997 | Gruber | 204/298.25 |
| 5,686,796 | * | 11/1997 | Boswell et al. | 204/298.37 |
| 5,695,564 | * | 12/1997 | Imahashi | 204/298.25 |
| 5,736,019 | * | 4/1998 | Bernick | 204/298.07 |
| 5,855,465 | * | 1/1999 | Boitnott et al. | 204/298.25 |

* cited by examiner

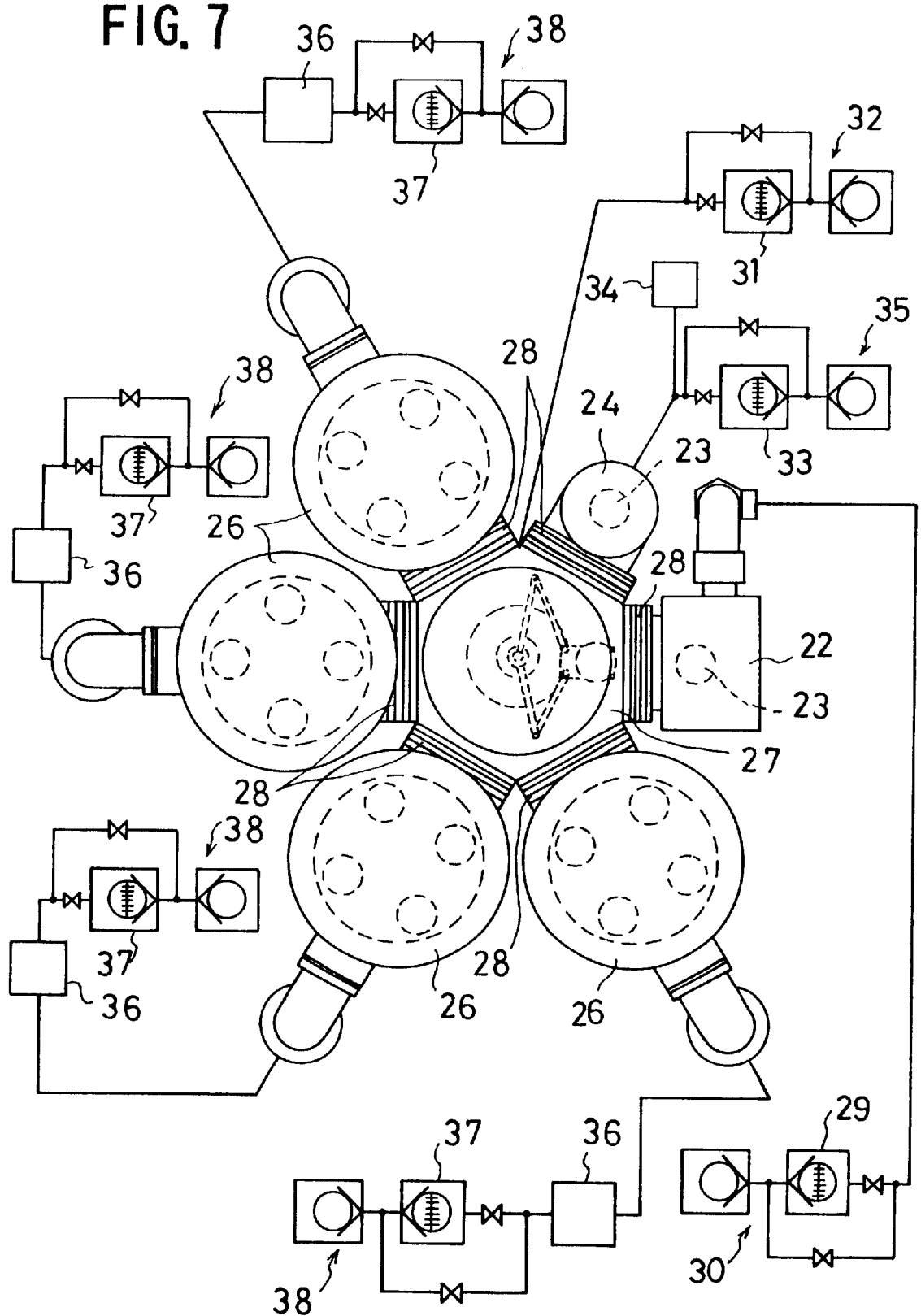

FIG. 13
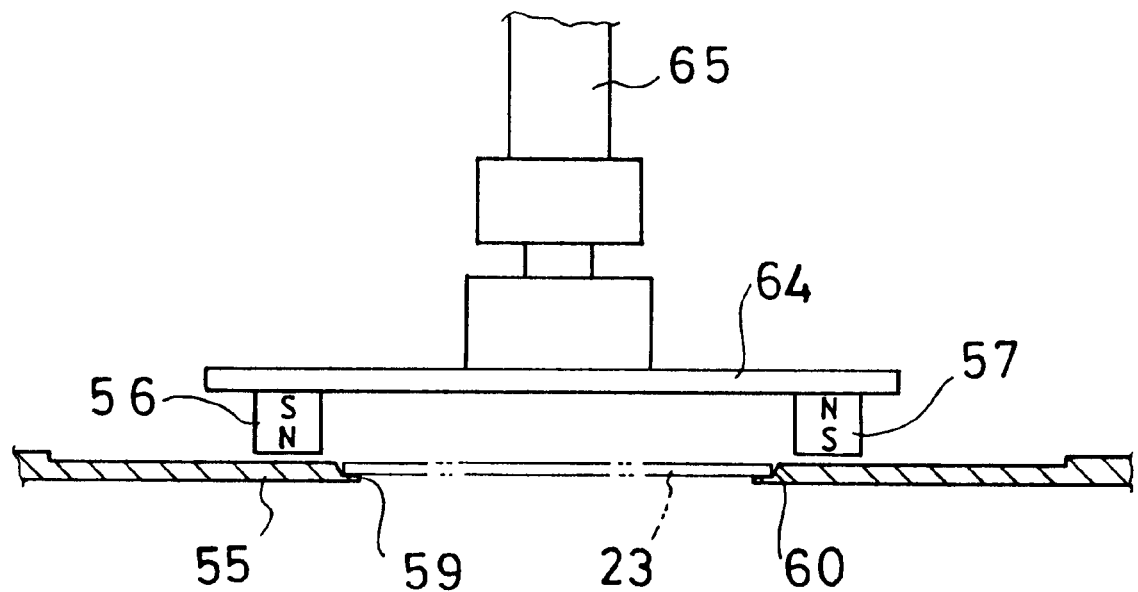
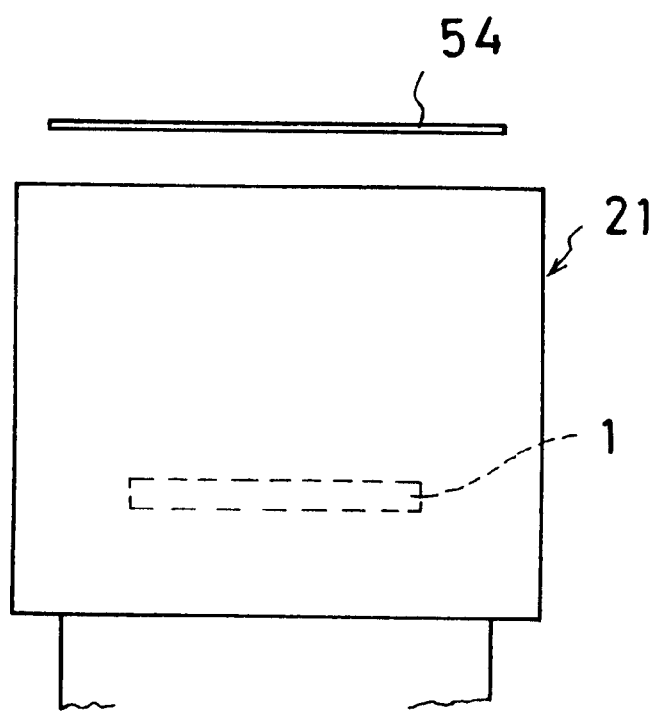

MAGNETRON SPUTTERING SOURCE ENCLOSED BY A MIRROR-FINISHED METALLIC COVER

BACKGROUND OF THE INVENTION

1. Field of the Invention

The present invention relates to a sputtering apparatus for depositing (or forming) a film by generating stable magnetron discharging in a high vacuum. It also relates to a sputtering film deposition apparatus which is suitable for manufacturing an element of a magneto-resistance head which replays the magnetic records by utilizing a magnetoresistance effect. It still furthermore relates to a method of manufacturing an element for a magnetoresistance head.

2. Description of the Related Art

As a sputtering apparatus, there is conventionally known the following type of apparatus. Namely, a permanent magnet is disposed behind a target. A magnetic field is generated in front of the target by this permanent magnet. A cathode electric potential is charged to the target to thereby generate magnetron discharge in front of the target. Sputtered particles from the target are thus caused to adhere or deposit in the form of a thin film to a substrate which is disposed opposite to the target. In this kind of magnetron sputtering apparatus with the above-described structure, however, there is a disadvantage in that the discharge does not occur or will become unstable in the vacuum in the order of $10^{-2}$ Pa, with the result that the film deposition can no longer be performed. In order to eliminate this kind of disadvantage, there has been proposed a magnetron sputtering apparatus of a type in which an radiofrequency (RF) induction coil is disposed in front of a target to thereby overlap (or combine) the electric discharge generated by electric charging to the RF induction discharge coil and the magnetron discharge together. This type of apparatus is called an inductively coupled RF plasma-assisted magnetron sputtering apparatus. In this apparatus, both direct current and high frequency can be used as the sputtering electric power. With this type of magnetron cathode in which a magnet is disposed behind the target, the uniformity in the thickness distribution of the film to be deposited on the substrate is poor. For example, in order to attain a uniformity of 3% or less within a surface of a substrate of 6 inches in diameter, a cathode of 12 inches must be provided. It has therefore a disadvantage in that the film deposition apparatus becomes very large in size in case a large number of cathodes must be provided in order to deposit multiple layers of films on the substrate.

Recently, a magnetoresistance head is under development as a means for replaying or reproducing magnetic records that have been recorded in high density. The above-described magnetoresistance head is to obtain a magnetoresistance effect by sequentially laminating (or repeating) a ferromagnetic film and a non-magnetic film. It has advantages in that the replay output does not depend on the peripheral speed of a recording disk, that there is no limit to the resonance frequency by the coil, and that the impedance noises can be reduced. For the above-described reasons, the magnetoresistance head is suitable as the means for replaying the high-density magnetic records. There are various kinds and structures of magnetoresistance heads. For example, as a shield type of magnetoresistance head, there is known one which has the film structure as shown in FIG. 1. In the figure, reference letter "a" denotes a substrate which is high in wear-resistance and low in thermal expansion such as AlTiC or the like. Reference letter b denotes a lower shield layer of FeSiAl or the like. Reference letter c denotes a lower gap layer of $Al_2O_3$ or the like. Reference letter d denotes a ferromagnetic hard bias layer of a cobalt (Co) based alloy, $Fe_3O_4$ or the like. Reference letter e denotes a ferromagnetic soft adjacent layer (SAL) of an NiFe based alloy, cobalt (Co) based amorphous or the like. Reference letter f denotes a magnetic separation layer of tantalum (Ta), copper (Cu) or the like. Reference letter g denotes a magnetoresistance (MR) stripe (ferromagnetic thin film) of NiFe or the like. Reference letter h denotes an electrode of Cu, gold (Au), tungsten (W) or the like. Reference letter i denotes an upper gap layer of $Al_2O_3$ or the like. Reference letter j denotes an upper shield layer of NiFe or the like. The MR stripe layer g functions to convert the signal magnetic field in the record medium to voltage through magnetoresistance effect. The magnetic separation layer f functions to magnetically separate the MR stripe layer g and the SAL layer e. The SAL layer e operates to apply a lateral bias to the MR stripe layer g. The hard bias layer d operates to magnetize the SAL layer e.

It is preferable to magnetically record on the record medium at an ultrahigh density. In order to well replay the magnetic record of ultrahigh density, e.g., of 1–20 Gbit/in$^2$ or more which is recorded on the record medium, the following proposal has been made. Namely, the ferromagnetic thin film which constitutes the MR stripe layer g is constructed in a single magnetic domain in which there is only one magnetic domain. On top of this, two or three layers of a nonmagnetic separation layer such as of Cu or the like, a magnetic layer of Co, and an antiferromagnetic layer of FeMn or the like are laminated in two or three layers to thereby form a spin valve magnetoresistance film. Or else, on top of the MR stripe layer g of single magnetic domain structure, there are alternately laminated, e.g., eight times, a layer made up of a set of a magnetic separation layer of Cu, a magnetic layer of Fe, and an anti-ferromagnetic layer of Ni or the like, thereby depositing a magnetic multilayer film such as a giant magnetic resistance film.

In depositing this kind of multilayer films, an ion beam sputtering apparatus is used, but it is poor in productivity. On the other hand, the applicant of the present invention has developed an inductively coupled RF plasma-assisted magnetron sputtering apparatus (called a helicon sputtering apparatus) in which, as shown in FIG. 2, an RF induction discharge coil 1 is disposed above a planer magnetron cathode k and in which sputtering can be performed in an ultrahigh vacuum. It has been found that a multiple layer film of a magnetoresistance head can be formed also by using this apparatus.

The above-described inductively coupled RF plasma-assisted magnetron sputtering apparatus has an advantage in that the film deposition by sputtering can be made while the inside of the film deposition chamber is maintained in a clean atmosphere of a high vacuum. However, the target is a consumable and must be replaced. When the sputtering apparatus is removed out of position to replace the worn target, the clean atmosphere inside the film deposition (or film-forming) chamber is destroyed. In case an ultrahigh vacuum in the order of $10^{-7}$ Pa or more (the term "more" means a vacuum of a larger degree, i.e., a vacuum towards $10^{-8}$ Pa) is required as the vacuum pressure inside the film deposition chamber, it is necessary to bake the inside of the film deposition chamber, in order to obtain a clean atmosphere at a short evacuating time, before reusing it after the sputtering apparatus has been mounted. In this sputtering apparatus, however, the target that is bonded to a backing plate will be removed out of position or the RF coil is damaged due to the heat of baking. This kind of damages are not favorable and must be avoided.

In order to manufacture a magnetoresistance head of multiple magnetic layers as described above, it is necessary to deposit magnetic films and magnetic separation layers which are clean in the film surfaces and are extremely as thin as in the order of 0.4–11 nanometers (nm) in multiple layers. For example, when an iron (Fe) film is formed on a silicon substrate to a thickness of 5.0 nm and, on top of it, a magnetic separation layer of Cu of a certain thickness and a layer of NiFe of 1 nm thick are alternately laminated for 20 times to thereby form a magnetic multiple film (giant magnetoresistance film), the magnetoresistance value (Magnetoresistance ratio, MR ratio) of this film will largely vary with the change in the thickness of the magnetic separation layer of Cu in the order of about 10 Angstroms, as shown in FIG. 3. It is therefore not easy to deposit the magnetic separation layer to a uniform thickness of 1 nm. Although the MR value at the second peak in the neighborhood of 2.1 nm in FIG. 3 is low, this thickness is considered to be suitable for practical use because the sensitivity to the change in the magnetic field is good. In order to efficiently form a 2.1 nm thick Cu film or an about 10 nm thick magnetic film which are flat and clean in the surfaces, an accurate film thickness control below 0.1 nm and an extremely clean atmosphere become necessary. The conventional ion beam sputtering apparatus is poor in productivity. The conventional type of magnetron sputtering apparatus, on the other hand, has a high atmosphere pressure and is too high in film deposition rate and is, therefore, difficult to manufacture it. Further, a mass-production system for manufacturing this kind of multiple layer film by using the inductively coupled RF plasma-assisted magnetron sputtering apparatus (helicon sputtering apparatus) has not been developed in concrete yet. In addition, as described above, in the conventional type of sputtering apparatus, the uniformity in the film thickness is poor, and there is the necessity of using a large-scale cathode which is far larger than the substrate. As a result, the film deposition chamber becomes large in size, and a multi-chamber type of film deposition apparatus in which multiple-layer films are deposited by providing a plurality of film deposition chambers becomes very large in size. Therefore, it has not been employed in practical manufacturing line.

Further, the magnetoresistance head is manufactured in a large number of pieces by depositing the necessary magnetic layers on substrates of about 5 inches in diameter and then by cutting the substrates into predetermined dimensions. However, if the direction of magnetization of the magnetic layers is not substantially uniform in each of the substrates, the electric resistance values of the MR stripe layers may vary from substrate to substrate and, consequently, homogeneous magnetoresistance heads cannot be obtained.

SUMMARY OF THE INVENTION

The present invention has an object of providing an inductively coupled RF plasma-assisted magnetron sputtering apparatus which can withstand the baking, in which the direction of sputtered particles is uniform, which is suitable for use in an ultrahigh vacuum, and in which a film can be deposited even to ultrafine portions of 1 $\mu$m or less. The present invention has another object of providing a relatively small-sized sputtering apparatus in which, by using the inductively coupled RF plasma-assisted magnetron sputtering apparatus, an extremely thin flat film of ten and several nm or less can be deposited in multiple layers, in which a control of a film thickness in the order of 0.1 nm is possible, and in which a multiple layer film with a clean film surface for use in a magnetoresistance head can be efficiently deposited. The present invention has still another object of providing a method of efficiently manufacturing an element for a magnetoresistance head by using the above-described apparatus such that the element has alternately deposited thereon flat and extremely thin films of ten and several nm thick or less and has a clean surface in each of the layers.

In order to attain the above and other objects, the present invention is a sputtering apparatus comprising: a permanent magnet for forming, in front of a target, a magnetic field for magnetron discharging, the permanent magnet being disposed behind the target; an RF induction discharge coil disposed in front of the target; wherein the permanent magnet is contained inside an evacuated cathode case which is in the form of a container and which is provided therein with a circulation passage for cooling water; and wherein the cathode case and the RF induction discharge coil are enclosed therearound by a metallic cover which has an aperture for emitting sputtered particles.

Preferably, the sputtering apparatus further comprises a backing plate for hermetically sealing a space for containing the permanent magnet inside the cathode case.

In order to attain another object, the present invention is a sputtering film deposition apparatus comprising: a load lock chamber whose pressure is changeable between atmospheric pressure at which a substrate is loaded from, or unloaded into, an atmosphere and a high vacuum in the order of $10^{-6}$ Pa or more; a pre-treatment chamber which is connected to the load lock chamber via an airtight substrate transfer passage, which is provided therein with an etching apparatus for cleaning the substrate that is transferred into the pre-treatment chamber, and which is evacuated to a high vacuum in the order of $10^{-6}$ Pa or more; a vacuum film deposition chamber which is connected to the pre-treatment chamber and the load lock chamber via airtight substrate transfer passages, which is provided therein with a plurality of sputtering apparatuses for depositing multilayer films on the substrate that is transferred into the vacuum film deposition chamber, and which is evacuated to an ultrahigh vacuum in the order of $10^{-7}$ Pa or more, each of the sputtering apparatuses being constituted in an inductively coupled RF plasma-assisted magnetron sputtering apparatus having a magnet disposed behind a target and an RF induction discharge coil disposed above the target; a shutter disposed in front of each of the sputtering apparatuses; the vacuum film deposition chamber having therein a permanent magnet for giving a magnetic field of uniform direction to the surface of the substrate, and a turn table which sequentially moves the substrate to a position facing each of the targets.

It is preferable to make the following arrangements. Namely, the etching apparatus is an electron cyclotron resonance type of ion beam etching apparatus provided with an ion source. The inductively coupled RF plasma-assisted magnetron sputtering apparatus comprises a metallic cover which has an aperture in a position facing a sputtering surface of the target and which covers peripheries of the target and the RF induction discharge coil. The inductively coupled RF plasma-assisted magnetron sputtering apparatuses are disposed in a lower portion of the vacuum film deposition chamber in a distance from each other, the turn table is disposed in an upper portion of the vacuum film deposition chamber, and a partition wall is provided in the distance. An evacuating system of the vacuum film deposition chamber comprises a turbo molecular pump via an ultralow temperature trap. Before the substrate is transferred from the pre-treatment chamber to the vacuum film deposition chamber, the pre-treatment chamber is evacuated again to $10^{-7}$ Pa or more so that the substrate can be transferred in a condition in which a gas does not leak from the pre-treatment chamber to the vacuum film deposition chamber.

In order to attain a still another object, the present invention is a method of manufacturing an element for a magnetoresistance head by alternately forming, on a substrate for the magnetoresistance head, multiple layers of extremely thin non-magnetic layers and magnetic layers, the method comprising: providing a high-vacuum load lock chamber; a high-vacuum pre-treatment chamber which has therein an etching apparatus; and an ultrahigh vacuum film deposition chamber which has therein a plurality of inductively coupled RF plasma-assisted magnetron sputtering apparatuses with one of a non-magnetic target and a magnetic target and an RF induction discharge coil above the target, and which has also a shutter for preventing the splashing of sputtered particles; cleaning the substrate by the etching apparatus in the pretreatment chamber by sequentially transferring, under a high vacuum, the substrate that has been transferred from an outside into the load lock chamber into the pre-treatment chamber and the vacuum film deposition chamber; and alternately depositing on the substrate extremely thin and flat multiple layers of non-magnetic layers and magnetic layers by each of the sputtering apparatuses by opening and closing the shutter, the substrate being moved inside the vacuum film deposition chamber to a position facing each of the sputtering apparatuses.

Preferably, the load lock chamber and the pre-treatment chamber are respectively evacuated to a high vacuum in the order of $10^{-6}$ Pa or more, the substrate is transferred in an ultrahigh vacuum in the order of $10^{-7}$ Pa or more, and the vacuum film deposition chamber is evacuated to an ultrahigh vacuum in the order of $10^{-7}$ Pa or more. The method further comprises, when the substrate is sputtered with one of the sputtering apparatuses provided with a magnetic target inside the vacuum film deposition chamber, applying a magnetic field of a predetermined direction to the film deposition surface of the substrate, whereby a magnetic layer magnetized in a predetermined direction is deposited. A sputtering gas is kept flowing inside the vacuum film deposition chamber during the film deposition by sputtering onto the substrate.

BRIEF DESCRIPTION OF THE DRAWINGS

The above and other objects and the attendant advantages of the present invention will become readily apparent by reference to the following detailed description when considered in conjunction with the accompanying drawings wherein:

FIG. 7 is a plan view thereof;

FIG. 13 is an enlarged view taken along the line 13—13 in FIG. 9;

DETAILED DESCRIPTION OF PREFERRED EMBODIMENTS

An explanation will now be made about an embodiment of the present invention with reference to the enclosed drawings.

Figure 4:
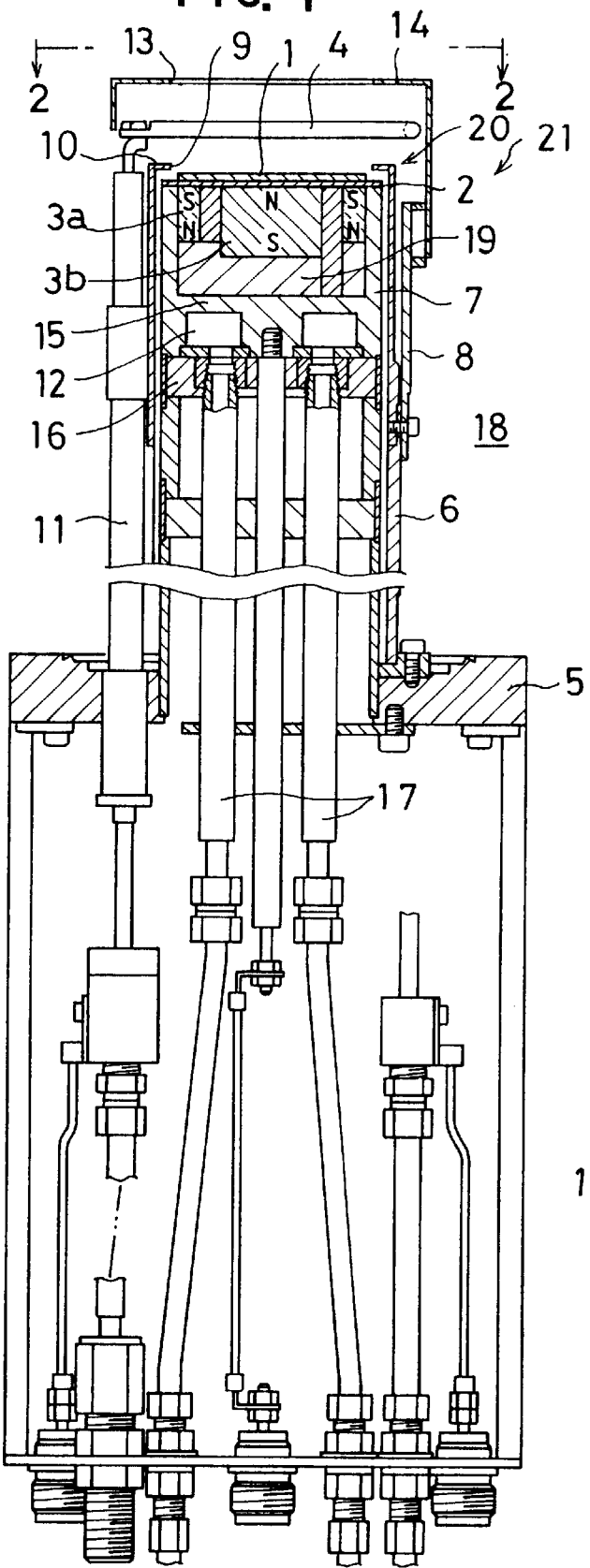
FIG. 4 is a sectional view showing an embodiment of the present invention.
Figure 5:
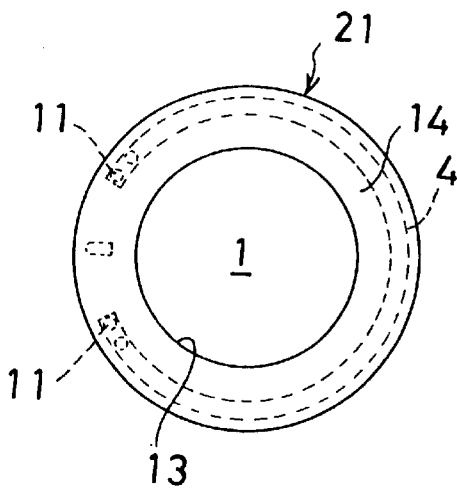
FIG. 5 is a plan view as seen from 2—2 in FIG. 4.

In FIGS. 4 and 5, reference numeral 1 denotes a target bonded to a backing plate 2 which constitutes an inductively coupled RF plasma-assisted magnetron sputtering apparatus 21. Reference numerals 3a, 3b denote permanent magnets which are disposed behind (or at the back of) the target 1 (the term "back" refers to the positional relationship as shown in FIG. 4). Reference numeral 4 denotes an RF induction discharge coil which is arcuate in shape and is disposed in front of the target 1 (the term "front" refers to the positional relationship as shown in FIG. 4). The permanent magnets 3a, 3b are mounted, via a cathode case 7, on a cylindrical electrode holding cylinder 6 which is mounted on a flange 5. This flange 5 has mounted thereon a metallic outer cylinder 8 which covers an outer periphery of the electrode holding cylinder 6. On a front end portion of this metallic outer cylinder 8, there is mounted an earth shield 10 with an aperture or opening 9 which is slightly larger in area than that of the target 1. Both ends of the RF induction discharge coil 4 are supported by two power supply rods 11, 11 which are disposed along the outer cylinder 8. The target 1, the backing plate 2, the permanent magnets 3a, 3b, and the cathode case 7 constitute a cathode 20. When direct current or RF (radiofrequency) electric power is introduced into this cathode 20, discharge occurs between the cathode 20 and an appropriate anode.

The above-described structure is substantially similar to that of the conventional magnetron sputtering apparatus. Namely, by the electric charge to the cathode 20, magnetron discharge which is restricted by the magnetic field of the permanent magnets 3a, 3b occurs. Since there is a disadvantage in that this discharge becomes unstable in an ultrahigh vacuum, the RF induction discharge coil 4 is also charged with electricity to thereby cause discharge to occur thereto. As a result of the combination of this induction discharge with the magnetron discharge, a stable discharge can be maintained even in an ultrahigh vacuum. In the above-described arrangement, however, there is a disadvantage in that the RF induction discharge coil 4 is subject to damages or the like at the time of baking. Therefore, in the inductively coupled RF plasma-assisted magnetron sputtering apparatus 21 of the present invention, the following arrangement has been employed. Namely, a circulation passage 12 for cooling water is provided inside the cathode case 7. The permanent magnets 3a, 3b are contained in a hermetically sealed manner inside the cathode case 7 in a condition in which the cathode case 7 is evacuated (i.e., is made to a vacuum). The RF induction discharge coil 4 and the cathode are covered therearound by a metallic cover 14 (shown/// which has an aperture 13 for emission of the sputtered particles and which is subjected to an internal treatment.

In the illustrated example, the cooling water circulation passage 12 is formed by annularly denting a partition wall 15 which is provided in an intermediate portion inside the cathode case 7 and then by placing a cover 16 to this dented portion. The above-described metallic cover 14 is made of a stainless steel which is mirror-finished (i.e., polished like a mirror surface) on the inside thereof. The aperture 13 for discharging the sputtered particles is made by forming a circular opening which is slightly larger in diameter than the diameter of the target 1. The cover 14 is mounted on the front end portion of the outer cylinder 8. The cooling water is supplied to, and discharged from, pipes 17, 17 which are connected to the cover 16. Reference numeral 19 denotes a yoke.

The above-described sputtering apparatus 21 is disposed inside a film deposition (or film-forming) chamber 18 which is evacuated. Film deposition by sputtering is performed by charging electric power to the cathode 20 and to the RF induction discharge coil 4. Since the target 1 is consumed (or wears away) with the lapse of time of its operation, the film deposition chamber 18 is once returned back to atmospheric pressure. The entire sputtering apparatus is taken out of the film deposition chamber 18 to thereby replace the worn target 1 with a new one. Thereafter, the sputtering apparatus is returned back to the film deposition chamber 18 to thereby perform the film deposition by sputtering again. In case there is a need for making the film deposition chamber 18 to an ultrahigh vacuum, the sputtering apparatus and the film deposition chamber must be baked. Here, the baking heat at this time is shut off by the metallic cover 14 and is also cooled by the cooling water which is circulated in the circulation passage 12. Therefore, the target 1 and the RF induction discharge coil 4 can be prevented from being damaged by the baking heat. In addition, since the permanent magnets 3a, 3b are disposed inside the vacuum cathode case 7, they are not damaged by heat, and the gas to be emitted from the magnets does not leak into the film deposition chamber 18.

Figure 1:
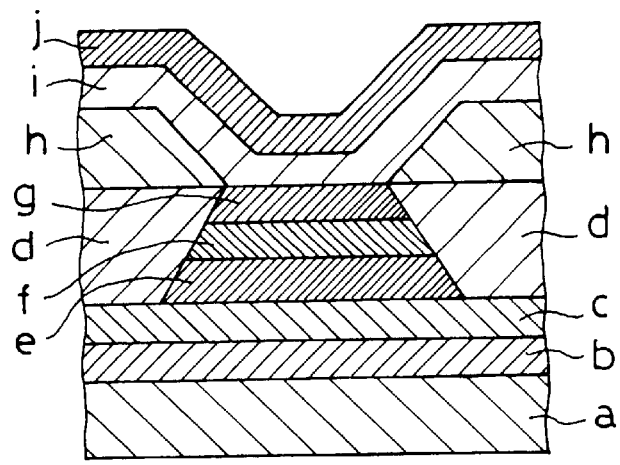
FIG. 1 is a schematic diagram explaining the construction of a film for a magnetoresistance head.
Figure 2:
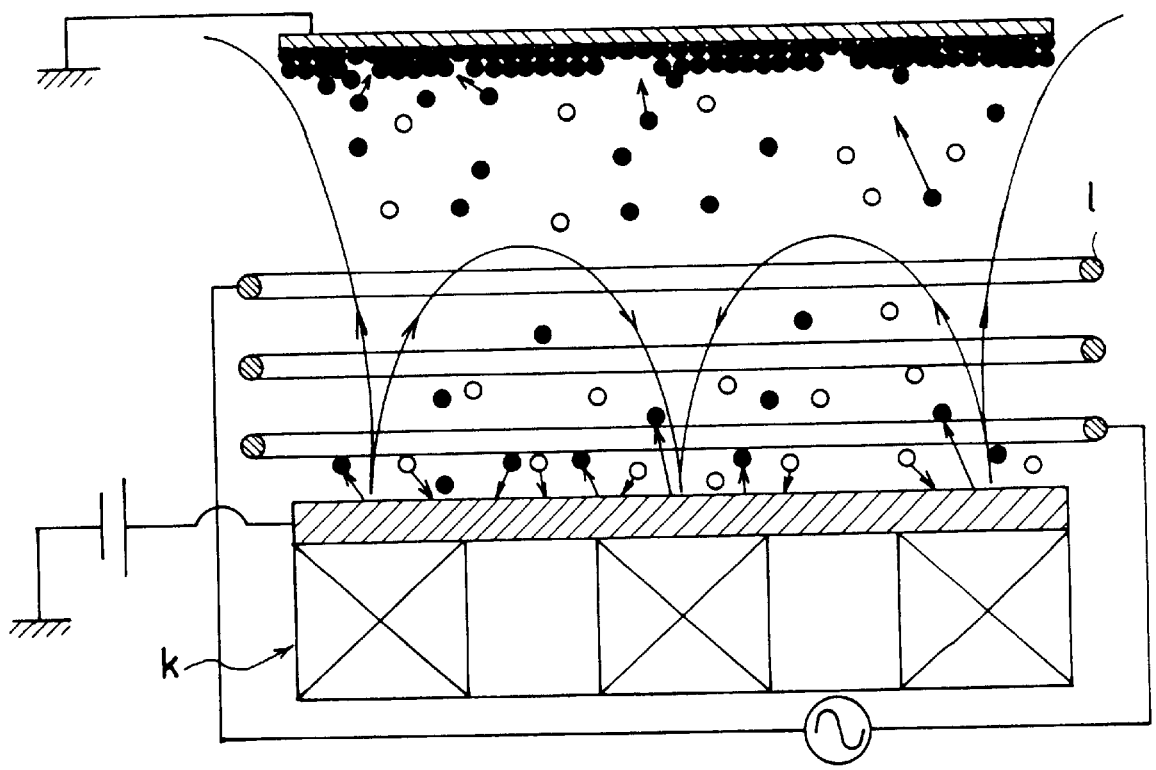
FIG. 2 is a sectional view of an important portion of an inductively coupled RF plasma-assisted magnetron sputtering apparatus.
Figure 3:
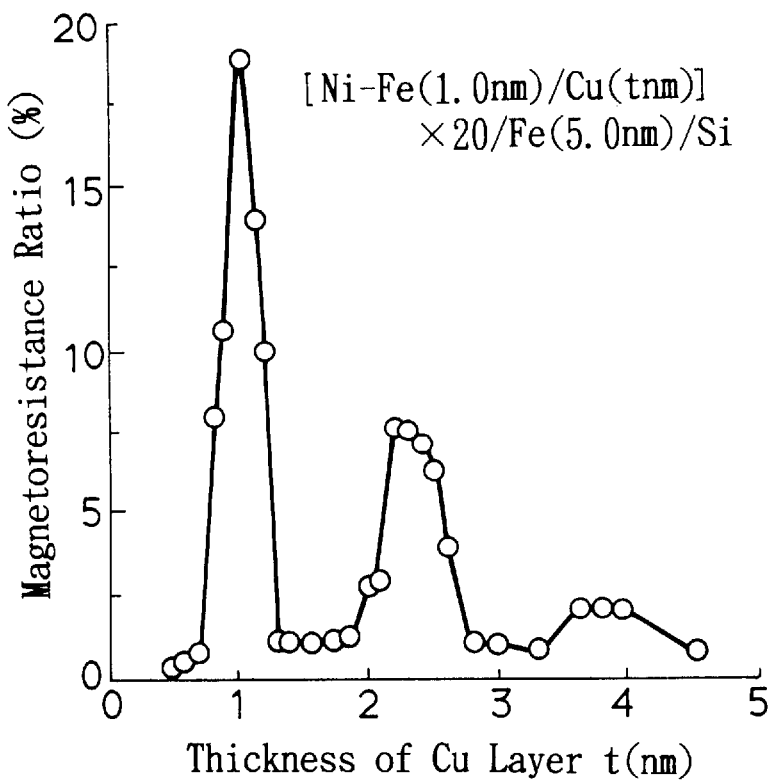
FIG. 3 is a graph showing the magnetic resistance values of magnetic multiple layers.
Figure 6:
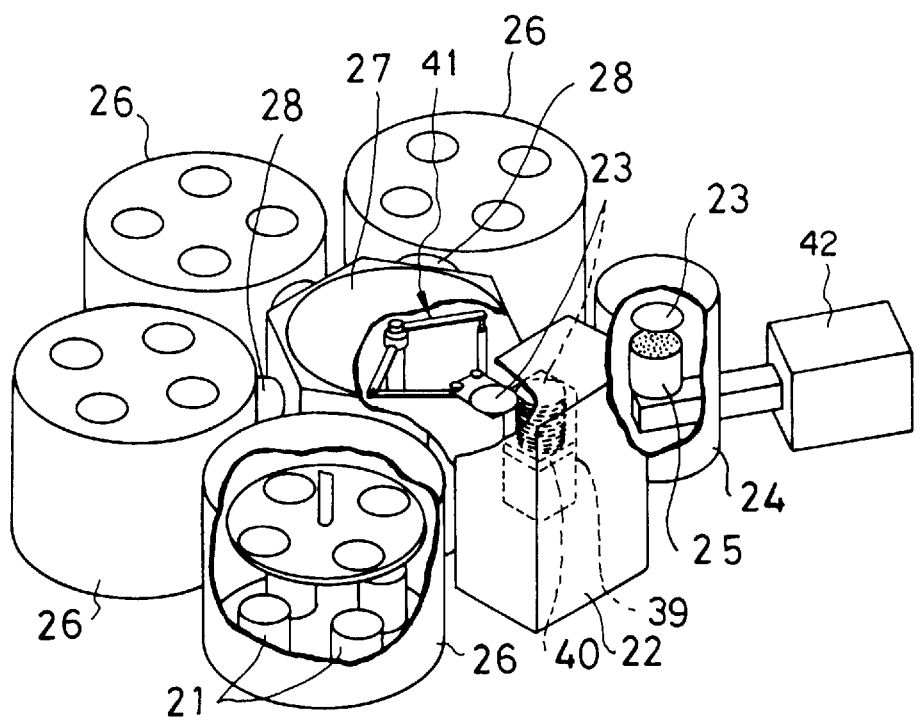
FIG. 6 is a general perspective view of an embodiment of a sputtering film deposition apparatus according to the present invention.

FIG. 6 and FIG. 7 show a general view of a sputtering film deposition apparatus which is constituted so as to be applicable to the manufacturing of a magnetoresistance head element by using the above-described sputtering apparatus 21. Referring to FIG. 6, this sputtering film deposition apparatus comprises: a hermetic load lock chamber 22 into, and out of, which the loading and unloading of a large number of substrates 23 in the form of silicon wafers with oxidized films thereon, AlTiC, or the like take place between the load lock chamber 22 and the outside thereof which is at atmospheric pressure; a pre-treatment chamber 24 which is provided with an etching apparatus 25 for performing cleaning to the substrates 23; and vacuum film deposition chambers 26 for depositing multilayer films to the substrates 23, the vacuum film deposition chambers 26 each being provided with a plurality of inductively coupled RF plasma-assisted magnetron sputtering apparatuses 21 and being evacuated to an ultrahigh vacuum in the order of $10^{-7}$ Pa or more (the term "more" means a vacuum of larger degree, i.e., a vacuum towards $10^{-8}$ Pa). In the illustrated example, there are provided four vacuum film deposition chambers 26. (In the explanations hereinbelow, these four vacuum film deposition chambers are referred to as 26a, 26b, 26c, and 26d when necessary to discriminate one another, but these reference letters are not shown in the figures.) These vacuum film deposition chambers 26 are disposed around a transport chamber 27 which is evacuated to a high vacuum, and are communicated with each other in order to transport the substrates, via substrate transport passages each provided with a gate value and the transport chamber 27.

Referring to FIG. 7, the load lock chamber 22 is evacuated to a high vacuum in the order of $10^{-6}$ Pa or more by an evacuating system 30 which is provided with a cryo pump or a turbo molecular pump 29. The transport chamber 27 which lies next to the load lock chambers 22 is evacuated to an ultrahigh vacuum in the order of $10^{-7}$ Pa or more by an evacuating system which is made up of a combination of a titan getter and an ion pump or by an evacuating system 32 which is provided with a turbo molecular pump 31. The pre-treatment chamber 24 is evacuated to a high vacuum in the order of $10^{-6}$ Pa or more by an evacuating system 35 which is provided with a turbo molecular pump 33 and a cryo (or cryogenic) pump 34. Each of the vacuum film deposition chambers 26 is quickly evacuated to an ultrahigh vacuum in the order of $10^{-7}$ Pa or more by an evacuating system 38 which is evacuated by a turbo molecular pump 37 via a trap 36 which is cooled to an ultralow temperature by liquid helium.

Referring again to FIG. 6, inside the load lock chamber 22, there is disposed a cassette case 39 so as to be movable up and down by an elevating table 40. The cassette case 39 is provided with multi-stage trays on which the substrates 23 are placed in position. Each of the substrates 23 is transported to the pre-treatment chamber 24 or to one of the vacuum film deposition chambers 26 by being placed on a transport arm 41 which extends from the transport chamber 27 into a space between respective trays in the cassette case 39. The substrate 23 whose film deposition in the vacuum film deposition chambers 26 has been completed is returned to the cassette case 39 inside the load lock chamber 22 by means of the transport arm 41. In the illustrated transport arm 41, there is used a frog-leg type of arm, but a robot transport apparatus of magnetic levitation type or the like may also be used.

Figure 8:
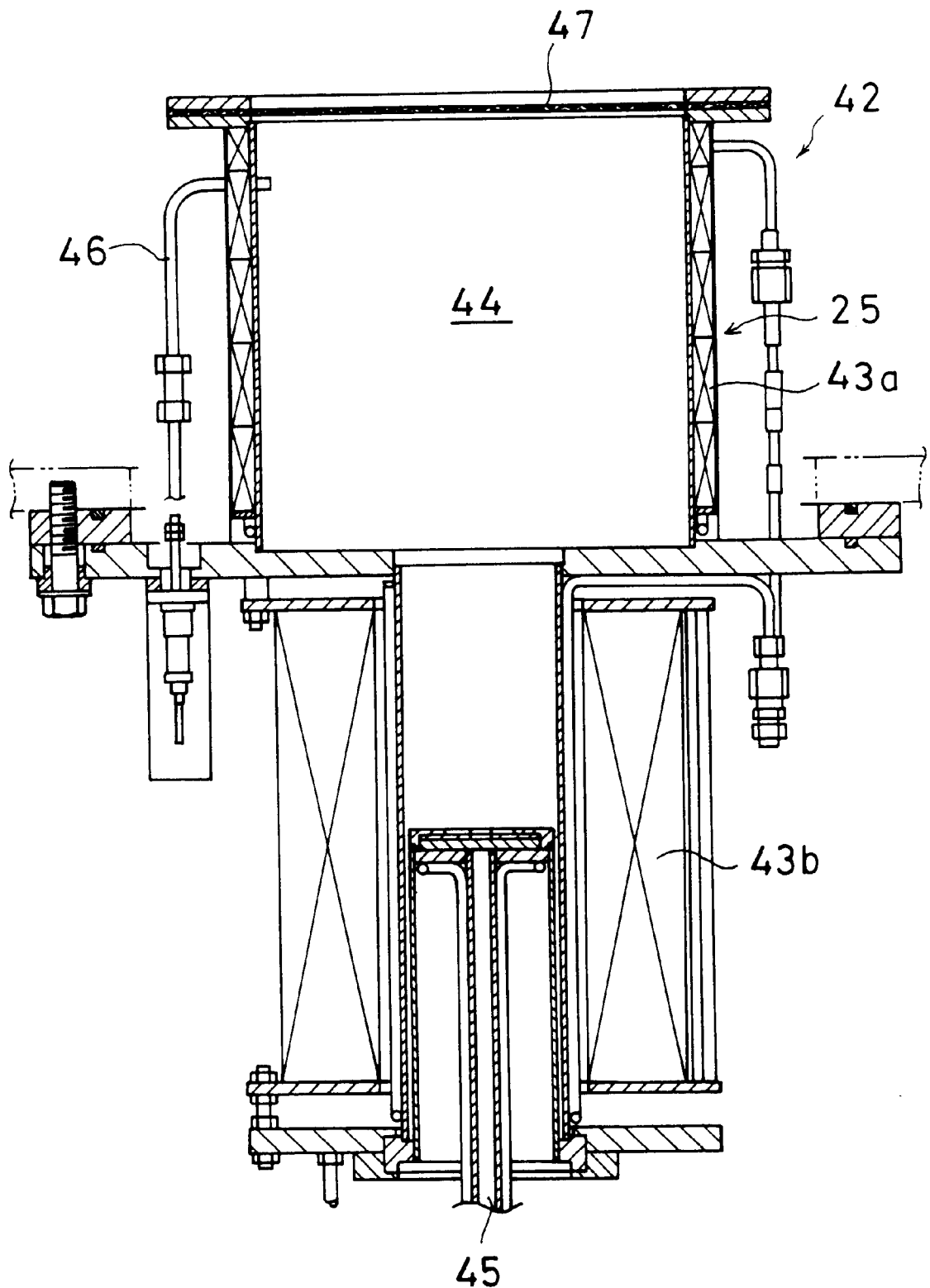
FIG. 8 is an enlarged sectional view of an important portion of an electron cyclotron resonance type of ion source used in the present invention.

In the pre-treatment chamber 24, there is disposed an ion beam etching apparatus 25 which is provided with an ion source such as an Electron Cyclotron Resonance type of ion source 42 of a relatively large aperture diameter of about 8 inches, or a Kaufman type of ion source, or an RF type of ion source which is relatively good in rectilinear propagation characteristics. An ion beam is irradiated onto a substrate 23 which is transported from the transport chamber 27 and is held by a holding apparatus (not illustrated) in a suitable position which is opposite to the ion beam etching apparatus 25. The film deposition surface (i.e., the surface on which the film is deposited) is thus cleaned. The Electron Cyclotron Resonance type of ion source 42 is of a conventional structure as shown in FIG. 8. In this structure, a micro-wave is introduced, via a microwave guide 45, into a discharge chamber 44 in which is formed an electron cyclotron resonance magnetic field by means of peripheral permanent magnets or electromagnets 43a and 43b. A mixture gas, for example, of argon (Ar) and oxygen (O$_2$) which is introduced into the electric discharge chamber 44 from a gas introduction pipe 46 is caused to be electrically discharged, and ion generated thereby is taken out by an outlet electrode 47. In this manner, there is performed, onto the substrate 23 in the opposite position, a cleaning and the necessary fine fabrication by means of ion etching. Instead of the mixture gas, only Ar gas or other noble gases may also be introduced into the electric discharge chamber 44.

Figure 9:
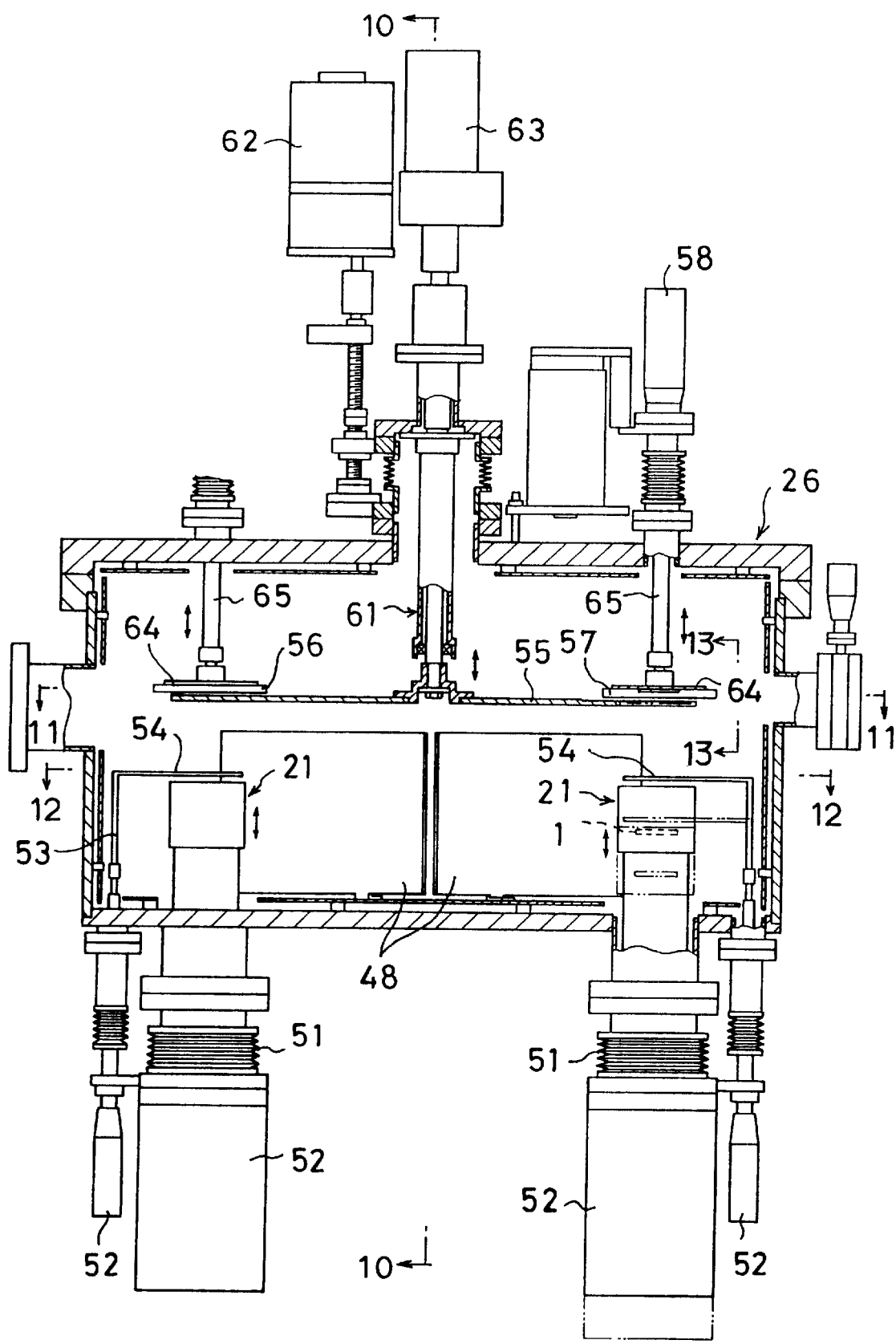
FIG. 9 is a sectional side view of a vacuum film deposition chamber in FIG. 6.
Figure 10:
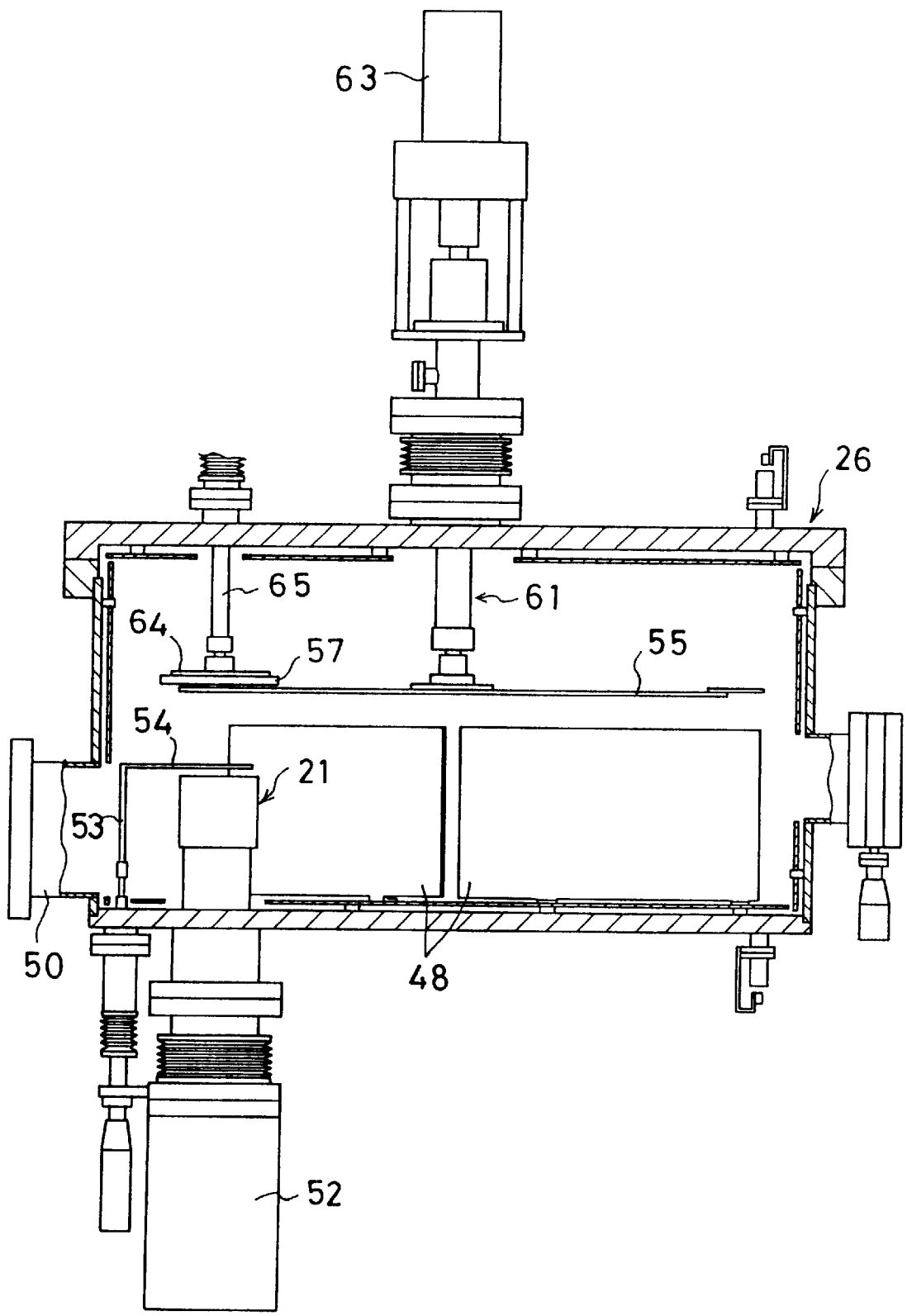
FIG. 10 is a sectional view taken along the line 10—10 in FIG. 9.

Detailed structure of each of the vacuum film deposition chambers 26 is shown in FIGS. 9 through 12. On a side surface of the substantially circular vacuum film deposition chamber 26 which is divided in its lower portion into four sections by means of partition walls 48, there are provided a gas inlet 49 for introducing Ar sputtering gas, and an evacuating port 50. The evacuating system 38 which is provided with the above-described ultralow temperature trap 36 of about 15K is connected to the evacuating port 50. On a lower surface of the partitioned portion sectioned by the partition walls 48 inside the vacuum film deposition chamber 26, there are disposed, at an equal distance from each other, four inductively coupled RF plasma-assisted magnetron sputtering apparatuses 21, with the sputtering surface facing upwards, so as to be movable up and down by an elevating device 52 which is provided with bellows 51. Above the sputtering surface of each of the sputtering apparatuses 21, there is disposed a disk-like turn table 55 which is rotatable and movable up and down with four substrates 23 placed thereon. The turn table 55 is movable up and down by means of an elevating device 52 which is provided with bellows 51. A shutter 54 is disposed in front of each of the sputtering apparatuses 21, i.e., between the sputtering apparatus 21 and the turn table 55 (the term "front" represents the positional relationship as shown in FIG. 9). The shutter 54 is opened and closed through the rotation by a rotary shaft 53. In addition, above some of the sputtering apparatuses 21, there are disposed permanent magnets 56, 57 which, during film deposition to the substrate 23 positioned therein, give a magnetic field of a predetermined direction in such a manner that the permanent magnets 56, 57 are moved up and down by an elevating device 58. The shutters 54 are also moved up and down by the rotary shaft 53 that is moved up and down by the elevating device 52.

Each of the inductively coupled RF plasma-assisted magnetron sputtering apparatuses 21 has the above-described construction. When the cathode 20 is charged with direct current or high-frequency current via the power supply rods 11, and RF current is charged to the RF induction discharge coil 4, there occurs in front of the target 1 a plasma which is restricted by the magnet field of the magnets 3 (3a, 3b), whereby the ion in the plasma sputters the target 1. The sputtered particles are ionized by the electric field of the RF induction discharge coil 4 and are dislodged (or emitted) towards the substrate 23 on the turn table 55 which lies opposite to the target 1. A thin film is thus deposited on the surface of the substrate 23. If the kinds of the adjacent targets 1 in the cathode 20 are varied from each other, when one substrate 23 rotates to a position above each of the cathodes 20, four layers of films of different materials can be deposited on the substrate 23. as the diameter of the target 1, Regarding the diameter, a target 1 whose diameter is smaller than that of the substrate 23 is used.

Figure 11:
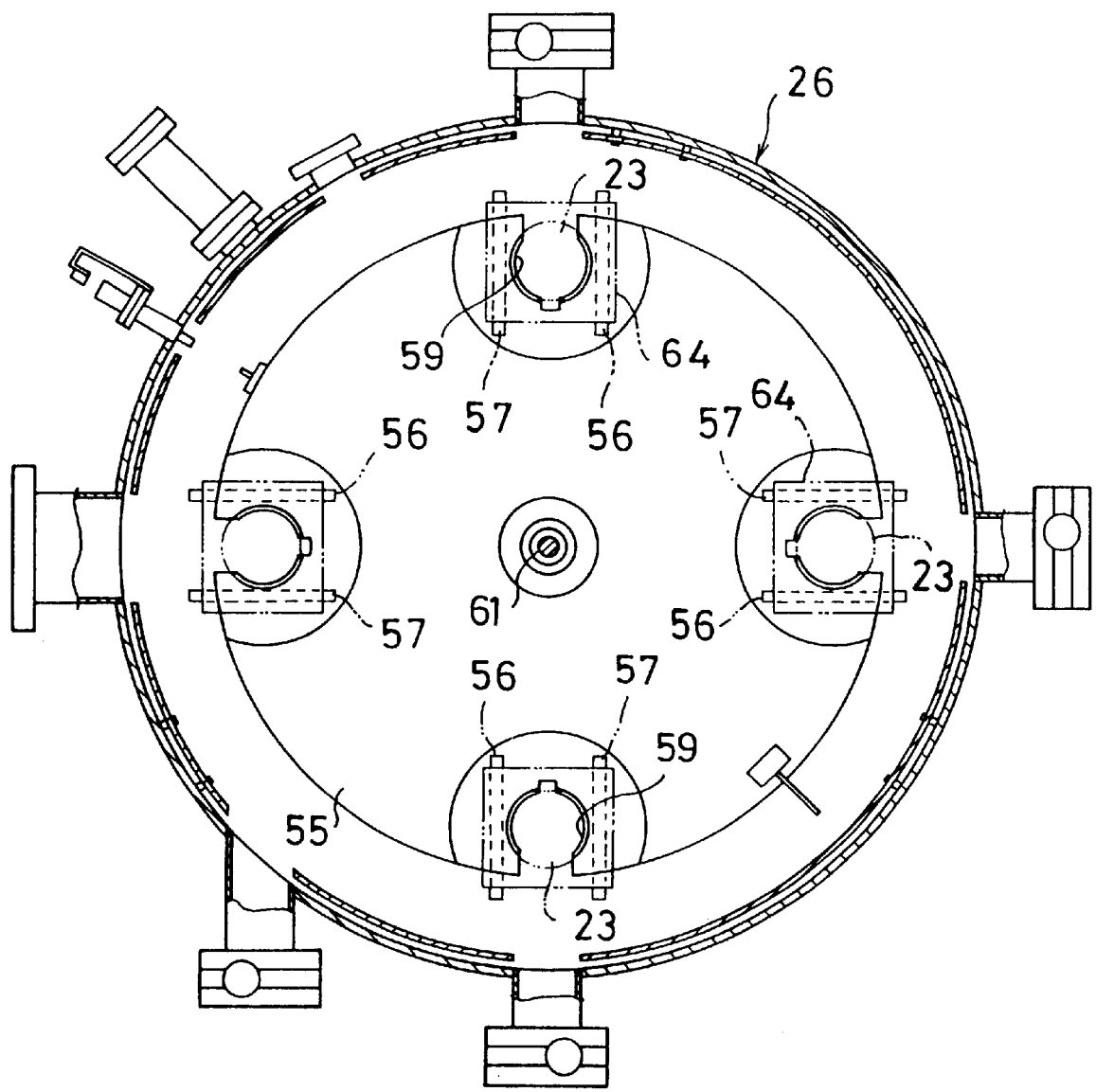
FIG. 11 is a sectional view taken along the line 11—11 in FIG. 9.
Figure 12:
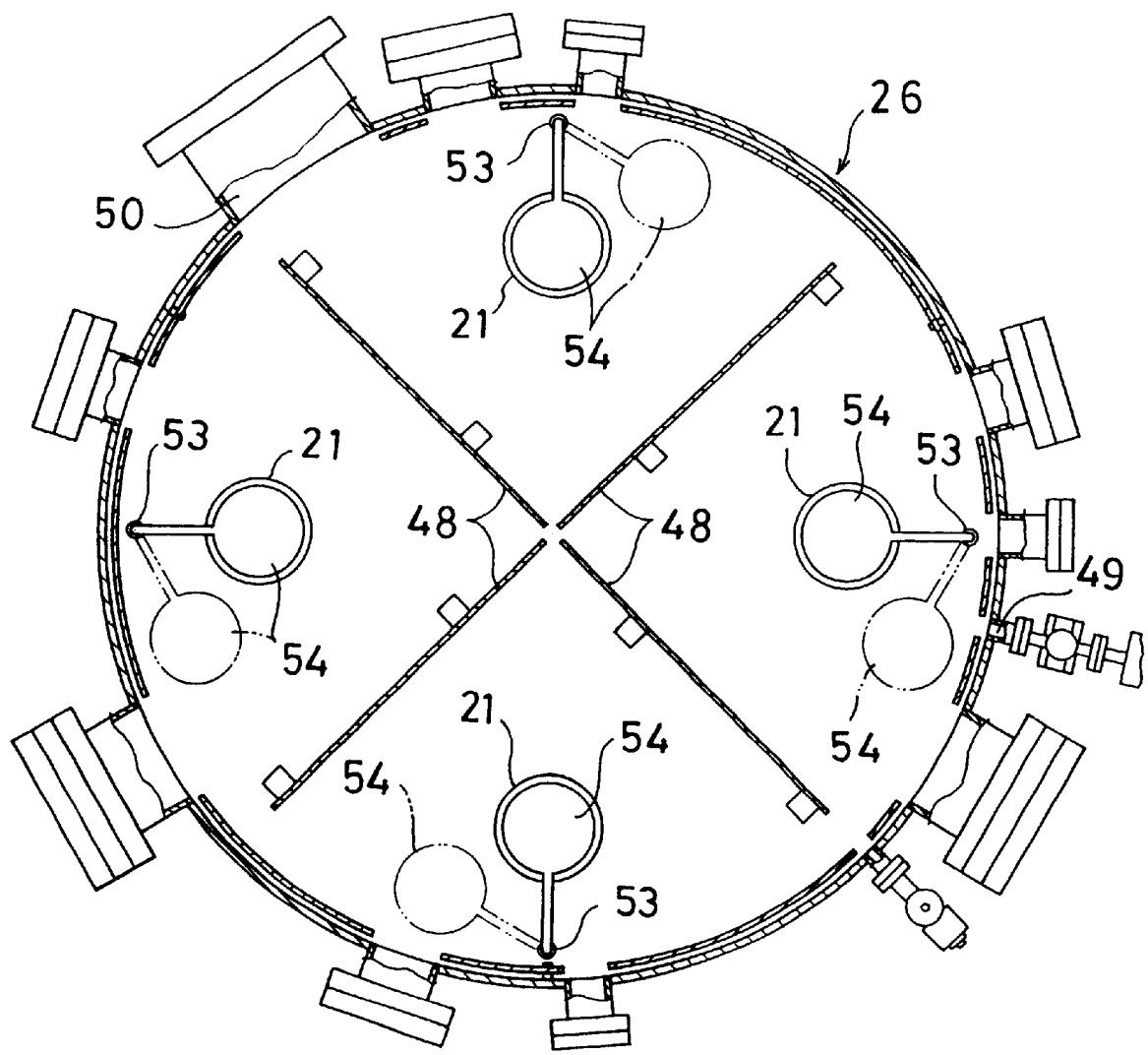
FIG. 12 is a sectional view taken along the line 12—12 in FIG. 9.

As shown in FIGS. 11 and 13, the turn table 55 is constituted by a table which is provided with four substantially circular openings 59 which are cut from the periphery of the turn table 55 diametrically inwards for placing four substrates 23 thereon. In the periphery of each of the openings 59, there is formed a stepped portion 60 for stably placing the substrate 23 thereon. That rotatable elevating shaft 61 of the turn table 55 which extends outwards through the vacuum film deposition chamber 26 is arranged to be moved up and down and to be rotatable by an elevating device 62 and a rotating device 63 which are disposed outside the vacuum film deposition chamber 26. The up and down movements of the turn table 55 are performed for the purpose of receiving, and handing over, the substrate 23 between the turn table 55 and the transport arm 41 in the transport chamber 27. When the substrate 23 is received from the transport arm 41, the turn table 55 stands by in advance in a lowered position and is thereafter elevated to receive the substrate 23. The transfer arm 41 then retreats (or move backwards). By the operations that are opposite to the above, the substrate 23 on the turn table 55 is handed over to the transfer arm 41.

Figure 14:
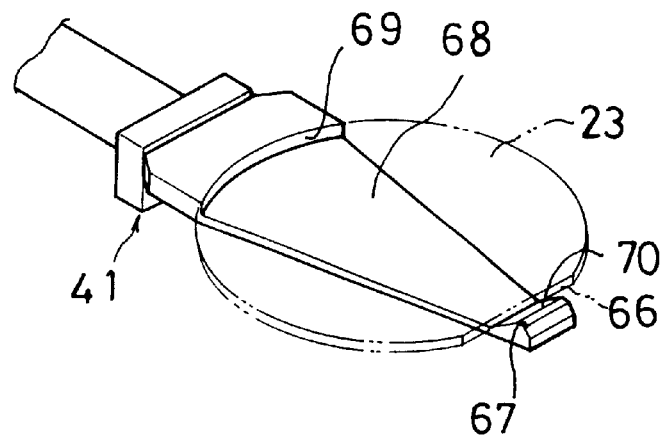
FIG. 14 is an enlarged perspective view of an important portion of a transfer arm.
Figure 15A:
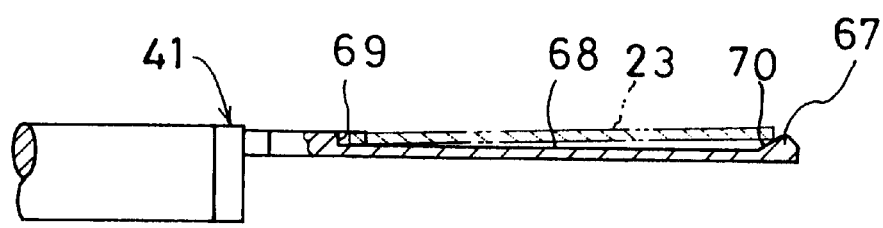
FIG. 15A and FIG. 15B are explanation views to show a condition in which a substrate has been placed out of alignment onto the transfer arm.
Figure 15B:
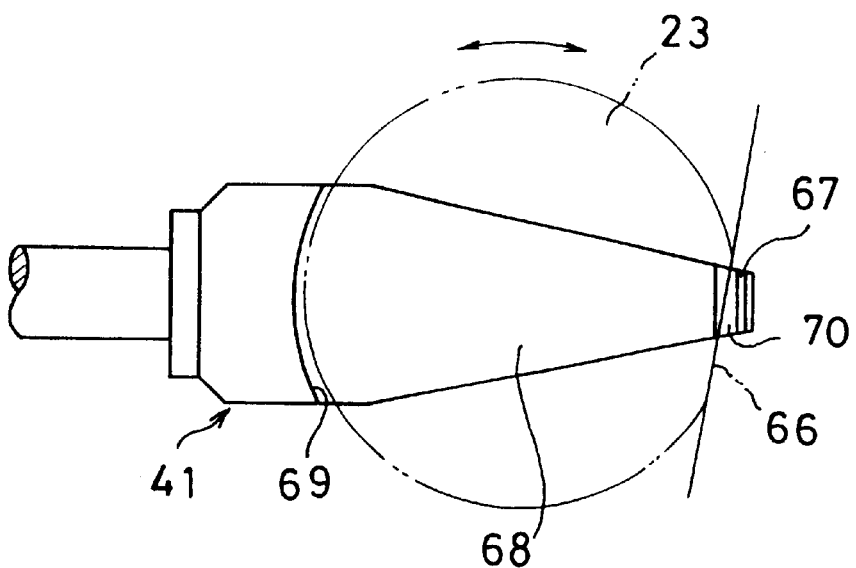
Figure 16:
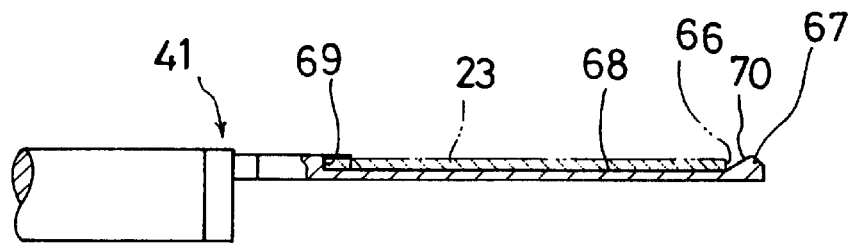
FIG. 16A and FIG. 16B are explanation views to show a condition in which the misalignment of the substrate as shown in FIGS. 15A and 15B has been corrected.
Figure 16:
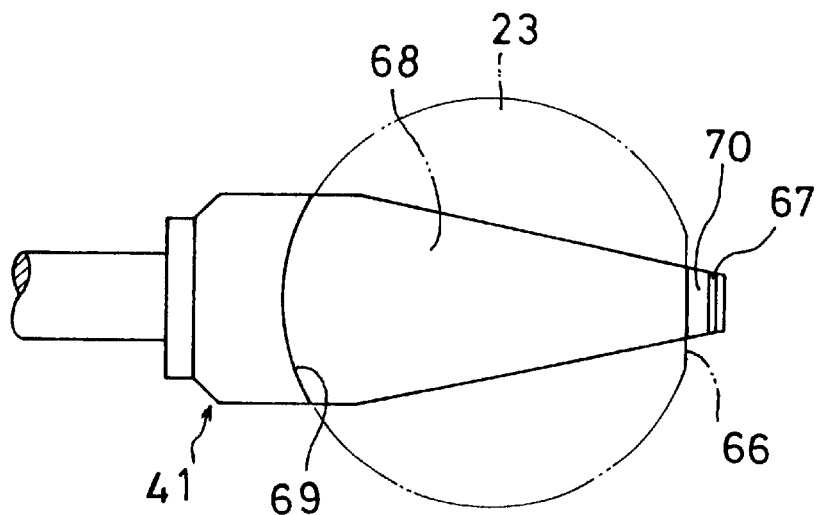

When a magnetic film is deposited on the substrate 23 which lies on the turn table 55 by the target 1 made of a magnetic material, a pair of elongated permanent magnets 56, 57 are positioned opposite to the film deposition surface of the substrate 23 i.e., facing a surface of the substrate which is opposed to the film deposition surface during the film deposition operation. A magnetic field of a uniform strength, e.g., of 100 oersted (Oe) in a predetermined direction is applied to the film deposition surface. In this manner, a predetermined direction of magnetization is given to the deposited magnetic film in order to obtain a magneto-resistance effect as a magnetoresistance head. The permanent magnets 56, 57 are attached to a plate-like holder 64 and are moved up and down by an elevating shaft 65 which is moved up and down by an outside elevating device 58 in a manner not to hinder the up and down movements of the turn table 55. When a plurality of magnetic layers are deposited on the substrate 23 for a magnetoresistance head, the holder 64 having the permanent magnets 56, 57 is disposed opposite each of the cathodes 20 for depositing the magnetic layers. In order to make uniform the direction of magnetization of each of the magnetic layers, the permanent magnets 56, 57 are positioned in a predetermined positional relationship with the substrate 23. As shown in FIG. 15A and 15B, an orientation flat 66 which is cut in a straight line is formed in part of the periphery of the substrate 23 i.e. which does not change during film deposition operation. In order to place the substrate 23 in a predetermined direction relative to the aperture 59 in the turn table 55, the following arrangement is made. Namely, as shown in FIG. 14, at the front end portion of the transfer arm 41 there are formed a straight engaging edge 67 which lies along the orientation flat surface 66, a knife-shaped flat surface 68 whose length corresponds to the smallest diameter of the substrate 23, and an arcuate engaging edge 69 on the inner side (i.e., the side away from the outer front end) of the transfer arm 41 so as to lie along the arc of the substrate 23. There is formed a downward slope surface 70 which continues from the top portion of the engaging edge 67 to the flat surface 68. According to this arrangement, when the substrate 23 is placed onto the transfer arm 41, the end edge of the substrate 23 slides along the slope surface 70 whereby the orientation flat 66 lies along the engaging edge 67. As a result, the angular direction of the substrate 23 is set in a predetermined direction on the transfer arm 41. Therefore, the substrate 23 can be placed from the transfer arm 41 onto the turn table 55 in a condition of being set or aligned in a predetermined direction. It follows that, as long as the permanent magnets 56, 57 for use in depositing the magnetic layer are made constant or aligned in their positions, the magnetic layers with the direction of magnetization being made uniform or being aligned can be formed on a large number of substrates 23. After the films have been deposited, the substrates 23 are cut in a uniform manner, whereby a large number of magnetoresistance heads of uniform quality with the direction of magnetization being aligned can be manufactured.

Figure 17:
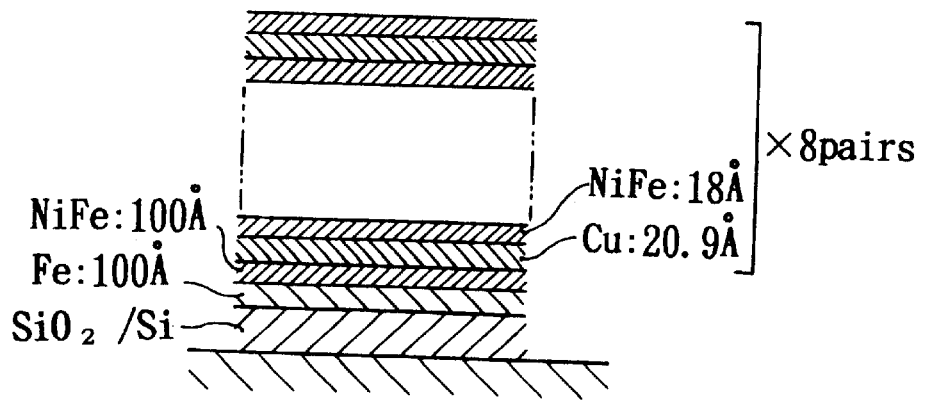
FIG. 17 is a structure diagram of multiple layer films of a magnetoresistance head manufactured by the apparatus of the present invention.

An explanation will now be made about the operations when a film for magnetoresistance head is deposited on a substrate 23 of silicon wafer of 6 inches in diameter with a thermal oxidation film by using the above-described apparatus, the film having the structure as shown in FIG. 17. The constitution of an upper part of this film is eight times of laminations of each set made up of 20.9 Angstroms of Cu and 18 Angstroms of NiFe (permalloy).

A cassette case holding therein 16 substrates 23 is contained in the load lock chamber 22. The load lock chamber 22 is evacuated to a high vacuum in the order of $10^{-6}$ Pa or more by means of the evacuating system 30. The transfer chamber 27 is also evacuated to an ultrahigh vacuum in the order of $10^{-7}$ Pa by means of the evacuating system 32. The pre-treatment chamber 24 is evacuated to a high vacuum in the order of $10^{-6}$ Pa or more by means of the evacuating system 35. As a result of these operations, the moisture and gas compositions adhered to the substrates 2 are removed. Subsequently, the gate valve of the load lock chamber 22 is opened, and the transfer arm 41 of the transfer device inside the transfer chamber 27 is advanced (or extended) into the load lock chamber 22 to thereby pick up a substrate 23 out of the cassette case. The gate valve of the pre-treatment chamber 24 is opened and the substrate 23 is placed on a holding device (not illustrated) inside the pre-treatment chamber 24. Thereafter, the pre-treatment chamber 24 is tightly closed and Ar gas mixed with 3% (by volume) of oxygen gas is introduced into the pre-treatment chamber 24. After having thus adjusted the pressure in the pre-treatment chamber 24 to about the order of $10^{-2}$ Pa, 300 volts (V) of acceleration voltage is applied to thereby operate the ion beam etching device 25. In this manner, the film deposition surface on the lower surface of the substrate 23 is cleaned by etching and, if necessary, etching is made to the electrically conductive portions or the like in a width of about 0.3 $\mu$m. In this example, the time duration of etching is 30 minutes, the etching rate is 100 Angstroms/min., and the uniformity is ±5%. As a result of this pre-treatment, the film deposition surface of the substrate 23 is completely cleaned. The gas to be introduced into the pre-treatment chamber 24 may be Ar only or other noble gases.

Once the pre-treatment has been finished, the pre-treatment chamber 24 is evacuated once again to the order of $10^{-7}$ Pa and the gate valve is then opened to take out the substrate 23 by the transfer arm 41. The substrate 23 is then transferred, by opening the gate valve, to one vacuum film deposition chamber 26a that has been evacuated in advance to an ultrahigh vacuum in the order of $10^{-7}$ Pa or more by means of the evacuating system 38. The transfer is made via the transfer chamber 27 of high vacuum in a manner not to contaminate the substrate 23. The pre-treated substrate 23 is transferred to a position above the turn table 55 that is in the lowered position and, with the upward movement of the turn table 55, the substrate 23 is received by the turn table 55 from the transfer arm 41.

The above-described operations are repeated two times in total. When two pre-treated substrates 23 are placed on the turn table 55 in a position 180 degrees away from each other, the gate valve of the vacuum film deposition chamber 26a is closed. The turn table 55 is thereafter moved up and down in order to adjust the distance between the target 1 of the inductively coupled RF plasma-assisted magnetron sputtering apparatus 21 and the substrate 23. Inside the vacuum film deposition chamber 26a there are disposed, on the four sputtering apparatuses 21, Fe targets 1 each with, e.g., a five-nine (99.999%) purity and $Ni_{81}Fe_{19}$ (wt %) targets 1 in an alternate order. Ar gas is introduced into the film deposition chamber 26a to thereby adjust the pressure therein to the order of $10^{-2}$ Pa, and each of the sputtering apparatuses is operated. Once each of the substrates 23 is in a position, e.g., 150 mm above the target of the sputtering apparatus 21 and once the permanent magnets 56, 57 are positioned in a predetermined position behind each of the substrates 23, each of the shutters 54 is opened to thereby deposit an Fe film while monitoring the film thickness by means of a film thickness monitor. The sputtering rate is extremely as small as 0.2–0.8 Angstrom/sec. When a predetermined film thickness of 100 Angstroms has been attained, each of the shutters is closed and the turn table 55 is rotated by 90 degrees to thereby locate each of the substrates above the next sputtering apparatus with the NiFe target. By disposing other permanent magnets 56, 57 behind the substrate, film deposition of NiFe film is performed to a predetermined thickness of 100 Angstroms. In this case, 60 watts (W), e.g., of direct current is charged to the cathode 20 of the sputtering apparatus 21 and 70 W of RF power is charged to the RF induction discharge coil 4. In this manner, a high-density plasma that is capable of magnetron discharging is formed in front of each target 1 even in a vacuum in the order of $10^{-2}$ Pa. Many of the sputtered particles that are sputtered at an extremely small sputtering rate are ionized by the RF induction discharge coil 4 and become incident on the substrate 23, whereby a thin flat film or layer is formed.

Once those two films in the lower layer in which the direction of magnetization is uniform have been formed, each of these substrates 23 is transferred by the transfer arm 41 to the next vacuum film deposition chamber 26b that has been evacuated in advance to an ultrahigh vacuum in the order of $10^{-7}$ Pa or more. By performing the same handing over of the substrate 23 as in the above-described vacuum film deposition chamber 26a, the substrate 23 is placed on the turn table 55 in a position 180 degrees away. In these four sputtering apparatuses in the vacuum film deposition chamber 26b, a Cu target and an Fe target are alternately disposed. First, each of the substrates 23 is positioned on each of the sputtering devices with a Cu target to thereby form a Cu film on each of the substrates 23 to a thickness of 20.9 Angstroms at the above-described sputtering rate by controlling to open and close the shutter 54. By disposing four sputtering apparatuses 21 inside one vacuum film deposition chamber, the time difference between one film forming and another film forming can be minimized. In order to perform sputtering while the surface condition of the film is still active, it is effective to dispose four or more sputtering apparatuses 21 inside the same vacuum film deposition chamber. Thereafter, the turn table 55 is rotated by 90 degrees to position each of the substrates 23 above the sputtering apparatus with an NiFe target. Also, the permanent magnets 56, 57 are positioned behind each of the substrates 23 so that the same direction of magnetization as that of the two films of the above-described lower layers can be given. While monitoring the film thickness, the shutter is controlled to thereby form an NiFe film of 18 Angstroms thick on top of the Cu film at the above-described sputtering rate. By rotating the turn table 55, the film deposition of the Cu film and the NiFe film is repeated eight times. In this manner, substrates each having that magnetic multiple layer films for use in a magnetoresistance head in which the direction of magnetization is uniform can be obtained. The substrates are returned to the cassette case in the load lock chamber 22 by means of the transfer arm 41. If necessary, the substrates 23 can be further transferred to another vacuum film deposition chamber 26d by the transfer arm 41 to thereby form a passivation film on each of them and can thereafter be returned to the load lock chamber 22. In the evacuation system 38 of each of the vacuum film deposition chambers 26, there is provided an ultralow temperature trap 36 of about 15K. Even a very small amount of molecules of water can surely be removed out of the vacuum film deposition chamber 26, whereby a clean ultrahigh vacuum can be attained therein. A film or a layer with a clean surface can thus be deposited. In addition, in manufacturing a giant magnetoresistance (GMR) element, it is important to supply each of the ultrahigh vacuum chambers with a clean gas. In the present apparatus, there are performed gas purification and conventional internal treatments such as a passive state treatment and an Ni plating treatment not only to filters but also to parts such as gas pipes, valves, etc. The pipes are bent into round shapes wherever possible so that acute corners are minimized. The sputtering gas is kept flowing to an overflow (or vent) line in a so-called vent-and-run manner even at the time other than sputtering.

An explanation has so far been made, for the sake of simplicity, about the operations for depositing films on two substrates as a unit. The following operations can also be made. Namely, during film deposition in the vacuum film deposition chamber 26b, pre-treatment is performed in the pre-treatment chamber 24 to the next substrate that has been taken out of the load lock chamber 22. That substrate is thereafter transferred to the film deposition chamber 26a and, after film deposition therein, film deposition of a set of Cu film and NiFe film is made eight times in another vacuum film forming chamber 26c. In this manner, the deposition of those films for a magneto-resistance head of a spin valve MR which are provided with magnetic multilayers can be made quickly on the substrate 23 that is transferred into the load lock chamber 22. If the film deposition of the set of Cu film and NiFe film is performed 30 times, the film deposition for magnetoresistance head of the giant MR can also be made.

As regards the position of the substrate on the turn table 55, the direction of the substrate is accurately determined when it is mounted on the transfer arm 41 by means of the engaging edge 67 and the down slope surface 69 that are provided in the transfer arm 41. Therefore, the direction of the substrate on the turn table 55 is also uniform and, consequently, the magnetic layer of uniform direction of magnetization can be formed on each of the substrates. The substrate on which the magnetic multilayer films and the passivation films have been formed is cut into the form of dies to serve as MR elements, with the direction of magnetization being aligned, and is then assembled into a magnetoresistance head of shield type or of yoke type.

EXAMPLE

Sixteen (16) substrates 23 of 6 inches in diameter for magnetoresistance heads made of silicon wafers with thermal oxidation films formed thereon are contained inside the load lock chamber 22 by placing them on the cassette case. The load lock chamber 22, the transfer chamber 27, the pre-treatment chamber 24, and the vacuum film deposition chamber 26 are evacuated to a vacuum in the order of $10^{-6}$ Pa, $10^{-7}$ Pa, $10^{-6}$ Pa and $10^{-7}$ Pa, respectively. By means of the transfer arm 41 one substrate was first transferred into the pre-treatment chamber 24 via the vacuum transfer chamber 27. Ar gas mixed with 3% (by volume) of oxygen gas was introduced into the pre-treatment chamber 24 to thereby adjust the pressure therein to $1.3 \times 10^{-2}$ Pa. By applying 300 V of acceleration voltage to the ECR etching apparatus 25, uniform etching of ±5% was performed at a rate of 50 Angstroms/min. The substrate 23 was thereafter transferred into the vacuum film deposition chamber 26a that was evacuated to the order of $10^{-7}$ Pa. Once two substrates 23 were mounted on the turn table 55 in the vacuum film deposition chamber 26a by repeating the above-described operations, Ar gas was introduced into the vacuum film deposition chamber 26a to thereby adjust the pressure therein to $7 \times 10^{-2}$ Pa. Then, 60 W of direct current (DC) was applied to the two cathodes 20 provided respectively with an Fe target and an NiFe target, and 70 W of high-frequency power was introduced into the RF induction coil 4. While giving a magnetic field of 100 Oe to the film deposition surface of the substrate 23 by means of the permanent magnets 56, 57, an Fe film and an NiFe film each of 100 Angstroms thick were sequentially formed at a sputtering rate of 0.1 through 0.8 Angstrom/sec. This is due to the fact that the opening and closing speed of the shutter is mechanically several hundreds milliseconds through 1 second, whereby the film thickness can be controlled to 0.1 Angstrom per 1 second at the time of the sputtering rate of 0.1 Angstrom/sec. For example, as compared with the fact that the film thickness of one layer of Si atoms is 3 Angstroms, this example enables to perform the control for 0.1 monolayer (0.1 layer) or less. These two substrates were further transferred into the above-described vacuum film deposition chamber 26b which was provided with two Cu targets and two NiFe targets, respectively. They were then placed on the turn table above the Cu target. The turn table was intermittently rotated by making the pressure conditions or the like inside the film deposition chamber 26b the same as those inside the film deposition chamber 26a. Eight layers of a set layer, each set having 20.9 Angstroms of Cu film and 18 Angstroms of NiFe film were thus deposited. Two substrates for magnetoresistance head having the film structure as shown in FIG. 17 were thus manufactured.

These substrates 23 were cut into a width of 3 mm for use as MR elements. The MR characteristics of each of these elements were evaluated in a direct current terminal method by using 4 terminal probes having a terminal-to-terminal distance of 5 mm. Each element showed an MR ratio of 5.83%, MR ratio being represented by an amount of change in the electrical resistivity of the MR stripe divided by the electrical resistivity of the MR stripe. The elements were found to be homogeneous and suitable for use as magnetoresistance heads. Further, the distribution of in-plane pressure in each layer was also measured, with the resultant values being ±1.1% in the Cu layer and ±2.0 through 2.1% in the NiFe layer. It was thus possible to obtain multilayers, with each layer being extremely excellent in uniformity. The surface of each layer was measured by X-rays, and it was observed that the surface was extremely flat and good in directivity and was clean with very little inclusion of gases.

As explained hereinabove, according to the present invention, the cooling water circulation passage is provided inside the cathode case of the inductively coupled RF plasma-assisted magnetron sputtering apparatus which has an RF induction discharge coil. The cathode case is evacuated and contains therein a permanent magnet, and the cathode case and the RF induction discharge coil are covered therearound with a metallic cover having an aperture for emitting the sputtered particles. Therefore, the RF induction discharge coil and the target can withstand the baking without damages thereto. A film deposition chamber can be quickly evacuated and has a simple construction, with the result that it can be manufactured at a smaller cost. Further, since the directivity of the sputtered particles is extremely superior, it is possible to perform film deposition to ultra-fine portions such as lines and holes of 1 μm or less.

Further, the sputtering film deposition apparatus is made up of: a load lock chamber whose pressure is changeable between atmospheric pressure and a high vacuum in the order of $10^{-6}$ Pa or more; a pre-treatment chamber of a high vacuum in the order of $10^{-6}$ Pa or more which is connected to the load lock chamber via an airtight substrate transfer passage and which is provided therein with an etching apparatus; and a vacuum film deposition chamber which is connected to the pre-treatment chamber and the load lock chamber via the airtight substrate transfer passages, which is provided therein with a plurality of sputtering apparatuses for depositing multilayer films on the substrate, and which is evacuated to an ultrahigh vacuum in the order of $10^{-7}$ Pa or more. Each of the sputtering apparatuses is constituted in an inductively coupled RF plasma-assisted magnetron sputtering apparatus, and the film deposition by the sputtering apparatuses is performed by giving a magnetic field of uniform directivity by a permanent magnet while controlling with a shutter. Therefore, there can be made multiple-layer films which are flat and clean in the surfaces and extremely thin in thickness. It has therefore an effect that the substrate having an MR ratio suitable for a magneto-resistance head can be efficiently manufactured by giving a uniform direction of magnetization to the magnetic films in the multiple-layer films.

In addition, the sputtering apparatuses are provided with a non-magnetic target or a magnetic target. The substrate which is transferred into the load lock chamber is sequentially transferred, under a high vacuum, to the pre-treatment chamber and the vacuum film deposition chamber. Cleaning to the substrate is performed by the etching apparatus in the pre-treatment chamber. Then, the substrate inside the vacuum film deposition chamber is moved to a position facing each of the sputtering apparatuses, and extremely thin multiple layers of alternate flat non-magnetic layers and magnetic layers are formed with each of the sputtering apparatuses by opening and closing the shutter. Therefore, there can be efficiently manufactured an element for magneto-resistance head that is flat and has alternate extremely thin nonmagnetic layers and magnetic layers and that is clean in the surface of each layer. When the target of a magnetic material is sputtered inside the vacuum film deposition chamber, magnetic layers that are magnetized in a uniform direction are deposited by applying a magnetic field of uniform direction to the film deposition surface, whereby the element can still be more efficiently manufactured. Furthermore, by keeping the sputtering gas flowing during film deposition by sputtering inside the vacuum film deposition chamber, layers with still cleaner surfaces can be formed.

It is readily apparent that the above-described sputtering apparatus, the sputtering film deposition apparatus and the method of manufacturing an element for a magnetoresistance head meet all of the objects mentioned above and also have the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A sputtering apparatus comprising:

a permanent magnet for forming a magnetic field in front of a target for magnetron discharging, said permanent magnet being disposed behind said target;

an RF induction discharge coil disposed in front of said target;

wherein said permanent magnet is contained inside an evacuated cathode case which is in the form of a container and which is provided therein with a circulation passage for cooling water; and wherein said RF induction discharge coil directly faces said magnetron discharging target, and said cathode case and said RF induction discharge coil are enclosed therearound by a metallic cover which has a mirror-finished inside surface and an aperture for emitting sputtered particles.

2. A sputtering apparatus as claimed in claim 1, further comprising an earth shield which covers said target, said earth shield having an aperture which is larger in area than that of said target, wherein said RF coil directly faces said earth shield.

* * * * *